US008748925B2

(12) United States Patent
Su et al.

(10) Patent No.: US 8,748,925 B2
(45) Date of Patent: Jun. 10, 2014

(54) PLATE

(75) Inventors: Po-Jen Su, Tainan (TW); Yun-Li Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/562,281

(22) Filed: Jul. 30, 2012

(65) Prior Publication Data

US 2013/0056776 A1    Mar. 7, 2013

(30) Foreign Application Priority Data

Sep. 6, 2011    (TW) .............................. 100132134 A

(51) Int. Cl.
*H01L 33/00*    (2010.01)
(52) U.S. Cl.
USPC ......................... 257/98; 257/99; 257/E33.072
(58) Field of Classification Search
CPC ....................................................... H01L 33/00
USPC ............................................ 257/174, 98–100
See application file for complete search history.

(56) References Cited

U.S. PATENT DOCUMENTS

| 2005/0168992 A1* | 8/2005 | Hirose .......................... 362/296 |
| 2007/0131956 A1* | 6/2007 | Lin ................................. 257/98 |
| 2010/0176415 A1* | 7/2010 | Lee et al. ........................ 257/98 |
| 2010/0230702 A1* | 9/2010 | Park ................................ 257/98 |
| 2011/0227111 A1* | 9/2011 | Choi et al. ...................... 257/98 |

* cited by examiner

*Primary Examiner* — Matthew W Such
*Assistant Examiner* — Frederick B Hargrove
(74) *Attorney, Agent, or Firm* — Jianq Chyun IP Office

(57) ABSTRACT

A plate including a substrate, a metal reflection layer and an oxidation protection layer is provided. The substrate has a first surface and a second surface opposite to the first surface. The metal reflection layer is disposed on the first surface of the substrate. The oxidation protection layer covers the metal reflection layer. The metal reflection layer is disposed between the oxidation protection layer and the first surface of the substrate. At least one light emitting diode chip is adapted to eutectic bonding on the plate.

16 Claims, 3 Drawing Sheets

PLATE

CROSS-REFERENCE TO RELATED APPLICATION

This application claims the priority benefit of Taiwan application serial no. 100132134, filed on Sep. 6, 2011. The entirety of the above-mentioned patent application is hereby incorporated by reference herein and made a part of this specification.

BACKGROUND OF THE INVENTION

1. Field of the Invention

The present invention relates to a plate, and more particularly to a plate adapted to eutectic bonding a light emitting diode (LED) chip.

2. Description of Related Art

As the environment protection consciousness rises nowadays, in addition to desperately searching a renewable energy source, people also put efforts on development of power saving products. For an illumination product, a power saving and environmental friendly light source, that is an LED chip, has been developed. The LED chip generates light by recombination of electrons and holes on a P-N junction. Compared with the conventional light sources, the LED chip has advantages such as low power consumption and long lifespan, and thus has been widely applied in all areas.

The LED chip is a current driven device and needs to be driven by a proper driver circuit. Generally speaking, the LED chip is packaged on a plate having the driver circuit. The method of packaging the LED chip on the plate mainly includes a wire bonding technology and a flip-chip technology. According to the wire bonding technology, the LED chip is mounted upright on the plate by a silver paste or a eutectic technique, and then the LED chip is wire bonded with the bonding pads on the plate by a metal wire. According to the flip-chip technology or referred to as the flip-flop packaging method, the LED chip is mounted with its top surface facing down on the plate by gold balls or a eutectic technique. The eutectic technique evaporates or sputters a layer of eutectic solder on the front or back side of the LED chip. Then, a gold layer is plated on a solder pad of the plate. Afterwards, the plate is placed on a heating board and heated to a melting point of the eutectic solder, then the LED chip is laminated on the solder pad and the gold on the solder pad is bonded with the eutectic solder on the LED chip. Thereafter, the temperature of the plate is lowered below the melting point of the eutectic solder to allow the eutectic solder to be cured, thereby finishing the die bonding process. However, to increase the light utilization efficiency of the LED chip, a metal reflection layer is additionally disposed on the outer layer of the plate in the prior art. When the LED chip is packaged by the above eutectic technique, the metal reflection layer of the plate may be exposed to a high temperature environment and actively reacts with the ambient air with the ambient gas to incur the oxidation problem.

SUMMARY OF THE INVENTION

The present invention provides a plate, which can overcome the problem that the metal reflection layer is easy to be oxidized in a high temperature process.

Other objectives and advantages of the present invention will be apparent from the technical features disclosed in the present invention.

To achieve one, a part of or all of the objectives or other objectives, an embodiment of the present invention provides a plate, which includes a substrate, a metal reflection layer and an oxidation protection layer. The substrate has a first surface and a second surface opposite to the first surface. The metal reflection layer is disposed on the first surface of the substrate. The oxidation protection layer covers the metal reflection layer. The metal reflection layer is disposed between the oxidation protection layer and the first surface of the substrate. At least one LED chip or a flip-chip LED chip is adapted to be disposed on the plate.

In an embodiment of the present invention, the metal reflection layer has a first wiring structure and a plurality of first bonding pads connected to the first wiring structure. The oxidation protection layer exposes the first bonding pads, and the LED chip is electrically connected to the first bonding pad through a wire and is further electrically connected to the first wiring structure. The flip-chip LED chip is electrically connected to the first wiring structure through the first bonding pads.

In an embodiment of the present invention, the plate may further include a conductive layer. The conductive layer is disposed between the first surface of the substrate and the metal reflection layer, and the conductive layer has a second wiring structure and a plurality of second bonding pads connected to the second wiring structure. The oxidation protection layer and the metal reflection layer expose the second bonding pads, and LED chip is electrically connected to the second bonding pad through a wire and is further electrically connected to the second wiring structure. The flip-chip LED chip is electrically connected to the second wiring structure through the second bonding pads.

In an embodiment of the present invention, the LED chip/flip-chip LED chip emits a light beam. A part of the light beam is delivered to the oxidation protection layer and reflected by the oxidation protection layer to depart from substrate.

In an embodiment of the present invention, the oxidation protection layer is a distributed Bragg reflector (DBR).

In an embodiment of the present invention, the oxidation protection layer includes a plurality of high refractive index layers and a plurality of low refractive index layers. The high refractive index layers and the low refractive index layers are stacked alternately, and a light transmittance of each high refractive index layer or low refractive index layer is higher than 92%.

In an embodiment of the present invention, a refractive index of the high refractive index layer is greater than or equal to 2, and a refractive index of the low refractive index layer is smaller than or equal to 1.7.

In an embodiment of the present invention, a material of the high refractive index layer is selected from among Si, $Ta_2O_5$, $TiO_2$, $Ti_3O_5$ and $Nb_2O_5$, and a material of the low refractive index layer is selected from among $SiO_2$ and $MgF_2$.

In an embodiment of the present invention, a roughness of the first surface of the substrate is smaller than 0.3 micrometer (μm).

In an embodiment of the present invention, a material of the metal reflection layer is selected from among Ag, Al, Au, Cu and a combination thereof.

In an embodiment of the present invention, a material of the oxidation protection layer is selected from among Si, $Ta_2O_5$, $TiO_2$, $Ti_3O_5$, $Nb_2O_5$, $SiO_2$, $MgF_2$ and a combination thereof.

Based on the above description, in the plate according to an embodiment of the present invention, the oxidation protection layer is disposed on the metal reflection layer to avoid the oxidation of the metal reflection layer in the high temperature process. The oxidation protection layer according to an embodiment of the present invention has the function of preventing the oxidation of the metal reflection layer and meanwhile has the effect of reflecting the light beam.

To make the above characteristics and advantages of the present invention apparent, the embodiments are illustrated in the following in accompanying with the drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
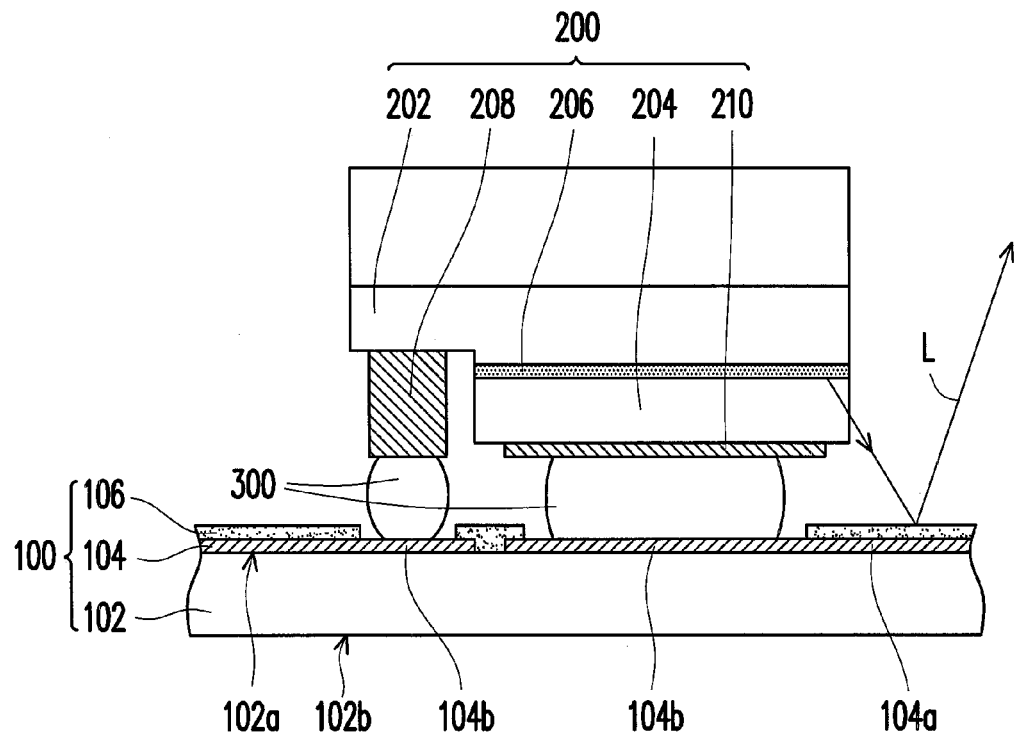
FIG. 1 is a schematic cross-sectional view of a plate according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1 is a schematic cross-sectional view of a plate according to a first embodiment of the present invention. Referring to FIG. 1, at least one flip-chip LED chip 200 is adapted to be disposed on a plate 100 of this embodiment. In FIG. 1, one flip-chip LED chip 200 is illustrated for example; however, the number of the flip-chip LED chips that can be carried on the plate of the present invention is not particularly limited. In other words, the plate 100 of the present invention may carry a plurality of flip-chip LED chips 200. In this embodiment, the flip-chip LED chip 200 includes a first-type doped semiconductor layer 202, a second-type doped semiconductor layer 204, a light-emitting layer 206, a first electrode 208 and a second electrode 210. The light-emitting layer 206 is disposed between the first-type doped semiconductor layer 202 and the second-type doped semiconductor layer 204. The first electrode 208 and the second electrode 210 respectively are disposed on the first-type doped semiconductor layer 202 and the second-type doped semiconductor layer 204. The first electrode 208 and the second electrode 210 face the plate 100, and are connected to the plate 100 through a die bonding structure 300.

In this embodiment, the first-type doped semiconductor layer 202 is for example an N-type semiconductor layer, and the second-type doped semiconductor layer 204 is for example a P-type semiconductor layer. The light-emitting layer 206 is for example a Multiple Quantum Well (MQW) formed by alternately stacking a gallium nitride (GaN) layer and an indium gallium nitride (InGaN) layer. A material of the first electrode 208 and the second electrode 210 is a conductive material selected from among Au, Ag, Pt, Cu, Cr, Al, other conductive materials and a combination thereof, but the present invention is not limited to this.

The plate 100 of this embodiment includes a substrate 102, a metal reflection layer 104 and an oxidation protection layer 106. The substrate 102 has a first surface 102a and a second surface 102b opposite to the first surface 102a. In this embodiment, a roughness of the first surface 102a may be smaller than 0.3 μm, so that the metal reflection layer 104 may be evenly laid on the first surface 102a to further achieve a good reflective function. It should be noted that when a roughness of the first surface 102a is smaller, the reflective effect of the metal reflection layer 104 is better. For example, when the roughness of the first surface 102a reaches below 0.01 μm, the metal reflection layer 104 presents a mirror reflection effect. In this embodiment, a material of the substrate 102 may be ceramic, sapphire, Si or SiC, but the present invention is not limited to this.

The metal reflection layer 104 of this embodiment is disposed on the first surface 102a of the substrate 102. In this embodiment, in addition to reflecting a part of the light beam L emitted by the flip-chip LED chip 200 to depart from the substrate 102, the metal reflection layer 104 may also be a wiring layer. In specific, the metal reflection layer 104 of this embodiment has a wiring structure 104a and a plurality of bonding pads 104b connected to the wiring structure 104a. The bonding pads 104b are exposed by the oxidation protection layer 106. The flip-chip LED chip 200 may be electrically connected to the wiring structure 104a through the bonding pads 104b. In this embodiment, a reflectivity of the metal reflection layer 104 to the part of the light beam L emitted by the flip-chip LED chip 200 is higher than 90%, and the material thereof is selected from among Ag, Al, Au, Cu and a combination thereof.

The oxidation protection layer 106 of this embodiment covers the metal reflection layer 104, and the metal reflection layer 104 is disposed between the oxidation protection layer 106 and the first surface 102a of the substrate 102. In this embodiment, a material of the oxidation protection layer 106 is selected from among Si, $Ta_2O_5$, $TiO_2$, $Ti_3O_5$, $Nb_2O_5$, $SiO_2$, $MgF_2$ and a combination thereof. It should be noted that as the oxidation protection layer 106 of this embodiment covers the metal reflection layer 104, when the flip-chip LED chip 200 is bonded on the plate 100 in the eutectic process (the process temperature is about 280° C.), the metal reflection layer 104 is hard to contact the ambient air to incur the oxidation or mobility problem. In this manner, after the eutectic process is finished, the metal reflection layer 104 may maintain the original good reflective characteristic, and further improve the light utilization efficiency of the flip-chip LED chip 200.

It should be particularly noted that in addition to the function of preventing the oxidation of the metal reflection layer, the oxidation protection layer 106 of this embodiment also has the effect of reflecting the light beam. The part of the light beam L emitted by the flip-chip LED chip 200 may be delivered in a direction to the plate 100 and cannot be utilized by a user. However, the oxidation protection layer 106 of this embodiment reflects the light beam L in a direction departing from the plate 100, thereby further improving the light utilization efficiency of the flip-chip LED chip 200. In specific, in contrast to the plate only having a metal reflection in the prior art, the oxidation protection layer 106 of this embodiment may raise the reflectivity of the plate 100 from 90% to above 98%.

Figure 2:
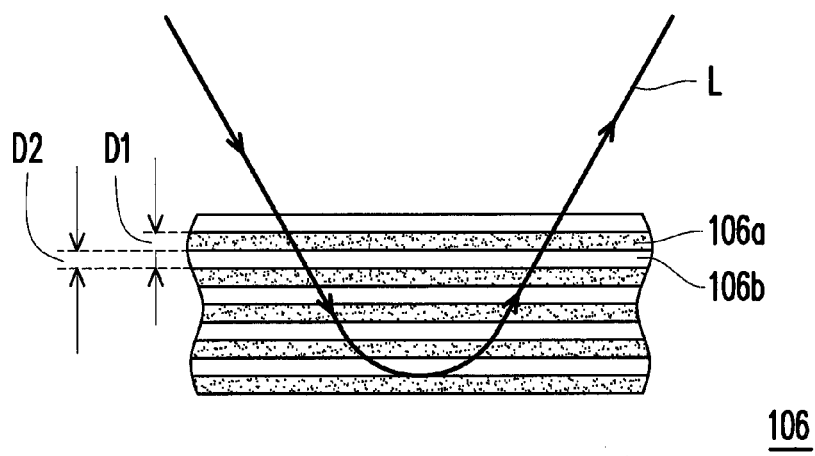
FIG. 2 is an enlarged schematic view of an oxidation protection layer in FIG. 1.

FIG. 2 is an enlarged schematic view of an oxidation protection layer 106 in FIG. 1. Referring to FIG. 2, for example, the oxidation protection layer 106 of this embodiment may be a DBR (distributed Bragg reflector). In more details, the oxidation protection layer 106 of this embodiment includes a plurality of high refractive index layers 106a and a plurality of low refractive index layers 106b. The high refractive index layers 106a and the low refractive index layers 106b may be stacked alternately. A light transmittance of each high refractive index layer 106a or low refractive index layer 106b may be higher than 92%. In this embodiment, the refractive index of the high refractive index layer 106a may be greater than or equal to 2, and the refractive index of the low refractive index layer 106b may be smaller than or equal to 1.7. A material of the high refractive index layer 106a is selected from among Si, $Ta_2O_5$, $TiO_2$, $Ti_3O_5$ and $Nb_2O_5$, and a material of the low refractive index layer 106b is selected from among $SiO_2$ and $MgF_2$. In addition, if a centre wavelength of the light beam L emitted by the flip-chip LED chip 200 is $\lambda$, a thickness D1 of each high refractive index layer 106a and a thickness D2 of each low refractive index layer 106b may be designed to be $\lambda/4$, and thus the oxidation protection layer 106 of the embodiment has a good reflective effect. However, the present invention is not limited to this, in other embodiments, the oxidation protection layer 106 may also be an oxidation protection layer made of a single material or may adopt another appropriate structure.

Figure 3:
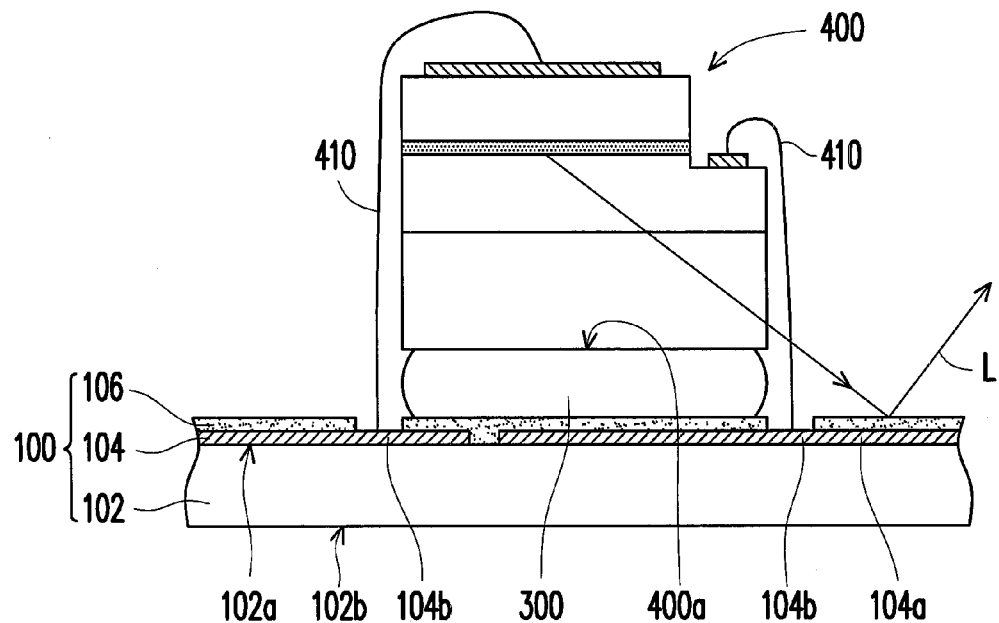
FIG. 3 illustrates the plate of the first embodiment of the present invention when bonded with another form of the LED chip.

It should be noted that in FIG. 1, the flip-chip LED chip 200 and the plate 100 of this embodiment are for example bonded. However, the categories of the LED chip bonded on the plate are not particularly limited in the present invention. FIG. 3 illustrates the plate of the first embodiment of the present invention when bonded with another form of the LED chip. Referring to FIG. 3, for example, the plate 100 of this embodiment may also be bonded with a wire bonding LED chip 400. The LED chip 400 may be electrically connected to the bonding pad 104b of the metal reflection layer 104 through a wire 410 (the material is for example a metal) and is further electrically connected to the wiring structure 104a of the metal reflection layer 104. On the other hand, a back side 400a of the wire bonding LED chip 400 may be connected to the oxidation protection layer 106 through the die bonding structure 300, and further the wire bonding LED chip 400 is mounted on the plate 100.

Second Embodiment

Figure 4:
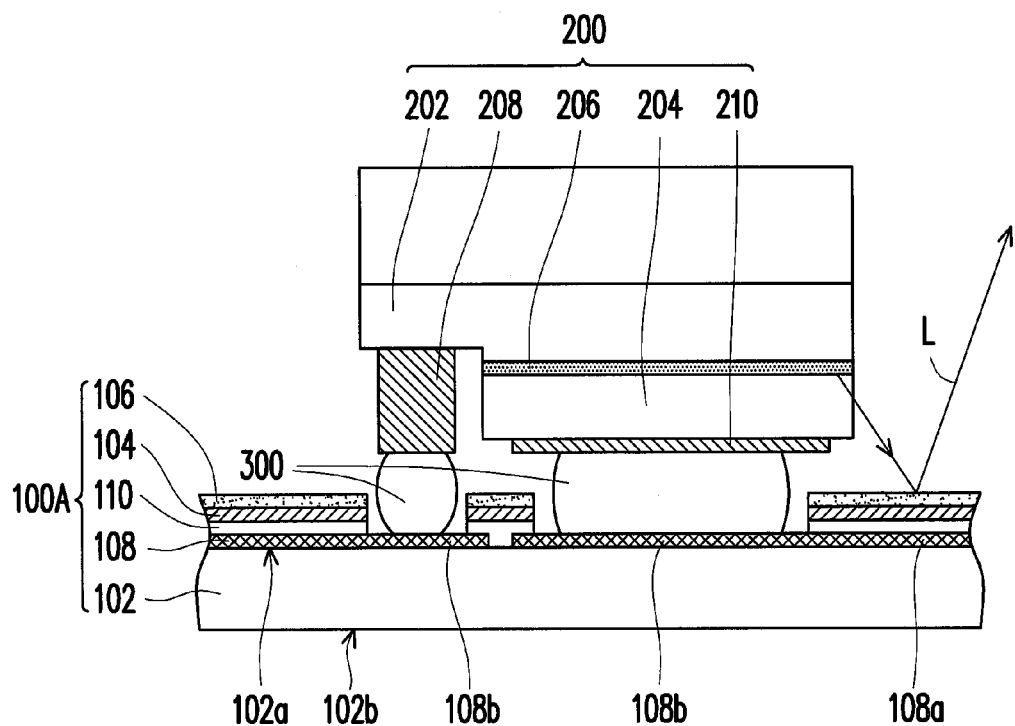
FIG. 4 is a schematic cross-sectional view of a plate according to a second embodiment of the present invention.

FIG. 4 is a schematic cross-sectional view of a plate according to a second embodiment of the present invention. Referring to FIG. 4, the plate 100A of this embodiment is similar to the plate 100 of the first embodiment. Therefore, the same parts are indicated by the same symbols in FIG. 1. The difference between the two lies in that the wiring structure and the bonding pads of this embodiment are not fabricated in the metal reflection layer 104, but are fabricated in the conductive layer 108 between the first surface 102a and the metal reflection layer 104. Hereinafter, only the difference is illustrated and the details of the same parts will not be repeated herein.

Referring to FIG. 4, at least one flip-chip LED chip 200 is adapted to be disposed on the plate 100A of this embodiment. The plate 100A of this embodiment includes a substrate 102, a metal reflection layer 104 and an oxidation protection layer 106. The substrate 102 has a first surface 102a and a second surface 102b opposite to the first surface 102a. The metal reflection layer 104 is disposed on the first surface 102a of the substrate 102. The oxidation protection layer 106 covers the metal reflection layer 104, and the metal reflection layer 104 is disposed between the oxidation protection layer 106 and the first surface 102a of the substrate 102.

Different from the first embodiment, the plate 100A of this embodiment may further include a conductive layer 108. The conductive layer 108 of this embodiment is disposed between the first surface 102a of the substrate 102 and the metal reflection layer 104. Furthermore, the plate 100A of this embodiment may further include an insulating layer 110. The insulating layer 110 is disposed between the conductive layer 108 and the metal reflection layer 104 to electrically insulate the conductive layer 108 and the metal reflection layer 104. The conductive layer 108 of this embodiment has a wiring structure 108a and a plurality of bonding pads 108b. The oxidation protection layer 106, the metal reflection layer 104 and the insulating layer 110 expose the bonding pads 108b. The flip-chip LED chip 200 is electrically connected to the wiring structure 108a through the bonding pads 108b. The plate 100A of this embodiment and the plate 100 of the first embodiment have the similar efficacies and advantages, so the details will not be repeated herein.

Figure 5:
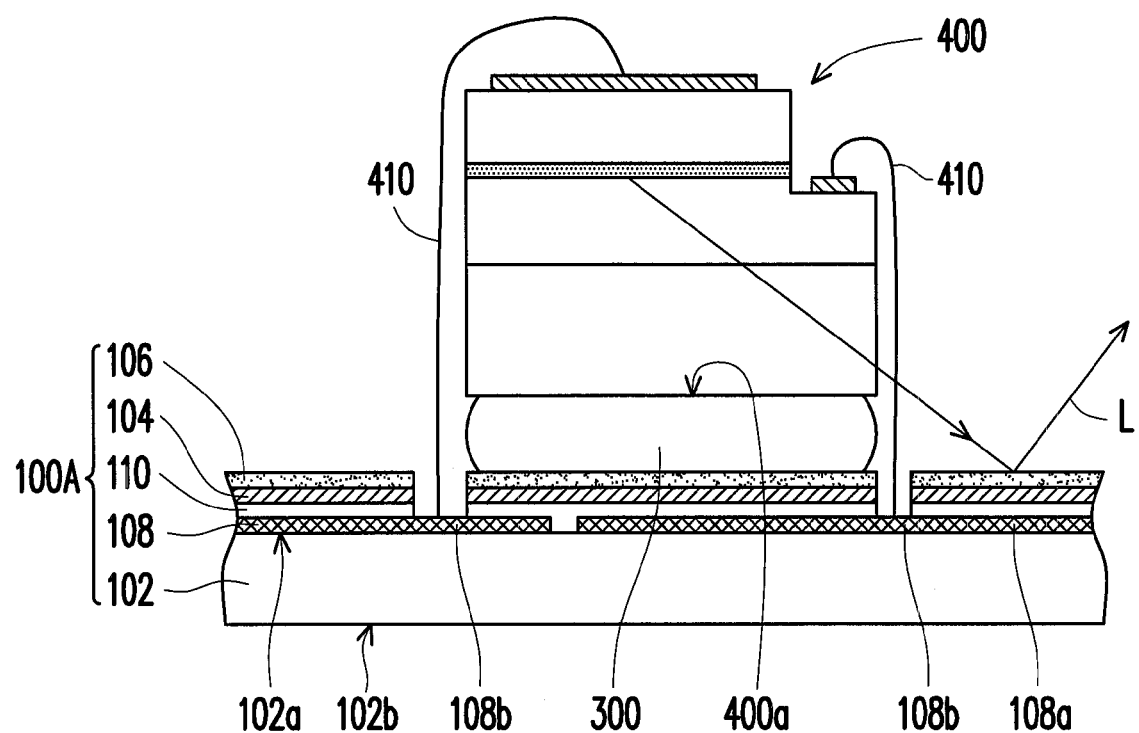
FIG. 5 illustrates the plate of the second embodiment of the present invention when bonded with another form of the LED chip.

It should be noted that in FIG. 4, the flip-chip LED chip 200 and the plate 100A of this embodiment are for example bonded. However, the categories of the LED chip bonded on the plate are not particularly limited in the present invention. FIG. 5 illustrates the plate of the second embodiment of the present invention when bonded with another form of the LED chip. Referring to FIG. 5, for example, the plate 100A of this embodiment may also be bonded with the wire bonding LED chip 400. The LED chip 400 may be electrically connected to the bonding pad 108b of the conductive layer 108 through a wire 410 (the material is for example a metal) and is further electrically connected to the wiring structure 108a of the conductive layer 108. On the other hand, the back side 400a of the wire bonding LED chip 400 may be connected to the oxidation protection layer 106 through the die bonding structure 300, and further the wire bonding LED chip 400 is mounted on the plate 100A.

In view of the above, in the plate according to an embodiment of the present invention, the oxidation protection layer is disposed on the metal reflection layer to avoid the oxidation of the metal reflection layer in the high temperature process. The oxidation protection layer according to an embodiment of the present invention has the function of preventing the oxidation of the metal reflection layer and meanwhile has the effect of reflecting the light beam. The oxidation protection layer according to an embodiment of the present invention may reflect a part of the light beam emitted by the flip-chip LED chip in a direction departing from the plate, thereby further improving the light utilization efficiency of the flip-chip LED chip.

Although the flip-chip LED chip is illustrated in the embodiments of the present invention, which however should not be regarded as the limitations to the present invention, the front side or back side eutectic die bonding technologies all fall within the protection scope of the present invention. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plate, wherein at least one flip-chip light emitting diode (LED) chip is adapted to be disposed on the plate, the plate comprising:
   a substrate, comprising a first surface and a second surface opposite to the first surface;

a metal reflection layer, comprising a first wiring structure and a plurality of first bonding pads connected to the first wiring structure, disposed on the first surface of the substrate; and an oxidation protection layer, covering the first wiring structure and exposing the first bonding pads, wherein the metal reflection layer is disposed between the oxidation protection layer and the first surface of the substrate, the flip-chip LED chip is electrically connected to the first wiring structure through the first bonding pads, the metal reflection layer exposes a portion of the first surface of the substrate, and the oxidation protection layer covers and directly connects to the portion of the first surface of the substrate.

2. The plate according to claim 1, wherein the flip-chip LED chip is adapted to emit a light beam, a part of the light beam is delivered to the oxidation protection layer and is reflected by the oxidation protection layer to depart from the substrate.

3. The plate according to claim 2, wherein the oxidation protection layer is a distributed Bragg reflector (DBR).

4. The plate according to claim 3, wherein the oxidation protection layer comprises a plurality of high refractive index layers and a plurality of low refractive index layers, and the high refractive index layers and the low refractive index layers are stacked alternately.

5. The plate according to claim 4, wherein a refractive index of the high refractive index layer is greater than or equal to 2, and a refractive index of the low refractive index layer is smaller than or equal to 1.7.

6. The plate according to claim 4, wherein a material of the high refractive index layer is selected from among Si, $Ta_2O_5$, $TiO_2$, $Ti_3O_5$ and $Nb_2O_5$, and a material of the low refractive index layer is selected from among $SiO_2$ and $MgF_2$.

7. The plate according to claim 1, wherein a roughness of the first surface of the substrate is smaller than 0.3 micrometer ($\mu m$).

8. The plate according to claim 1, wherein a material of the oxidation protection layer is selected from among Si, $Ta_2O_5$, $TiO_2$, $Ti_3O_5$, $Nb_2O_5$, $SiO_2$, $MgF_2$ and a combination thereof.

9. A plate, wherein at least one light emitting diode (LED) chip is adapted to be disposed on the plate, the plate comprising:

a substrate, comprising a first surface and a second surface opposite to the first surface;

a metal reflection layer, disposed on the first surface of the substrate; and an oxidation protection layer, covering the metal reflection layer, wherein the metal reflection layer is disposed between the oxidation protection layer and the first surface of the substrate, the metal reflection layer comprises a first wiring structure and a plurality of first bonding pads connected to the first wiring structure, the oxidation protection layer covers the first wiring structure and exposes the first bonding pads, the LED chip is electrically connected to the first bonding pad through a wire, and the metal reflection layer exposes a portion of the first surface of the substrate, and the oxidation protection layer covers and directly connects to the portion of the first surface of the substrate.

10. The plate according to claim 9, wherein the LED chip is adapted to emit a light beam, a part of the light beam is delivered to the oxidation protection layer and is reflected by the oxidation protection layer to depart from the substrate.

11. The plate according to claim 9, wherein the oxidation protection layer is a distributed Bragg reflector (DBR).

12. The plate according to claim 11, wherein the oxidation protection layer comprises a plurality of high refractive index layers and a plurality of low refractive index layers, and the high refractive index layers and the low refractive index layers are stacked alternately.

13. The plate according to claim 12, wherein a refractive index of the high refractive index layer is greater than or equal to 2, and a refractive index of the low refractive index layer is smaller than or equal to 1.7.

14. The plate according to claim 12, wherein a material of the high refractive index layer is selected from among Si, $Ta_2O_5$, $TiO_2$, $Ti_3O_5$ and $Nb_2O_5$ and a material of the low refractive index layer is selected from among $SiO_2$ and $MgF_2$.

15. The plate according to claim 9, wherein a roughness of the first surface of the substrate is smaller than 0.3 micrometer ($\mu m$).

16. The plate according to claim 9, wherein a material of the oxidation protection layer is selected from among Si, $Ta_2O_5$, $TiO_2$, $Ti_3O_5$, $Nb_2O_5$, $SiO_2$, $MgF_2$ and a combination thereof.

* * * * *